(12) United States Patent
Ishizawa et al.

(10) Patent No.: US 7,371,683 B2
(45) Date of Patent: May 13, 2008

(54) METHOD FOR CARRYING OBJECT TO BE PROCESSED

(75) Inventors: Shigeru Ishizawa, Nirasaki (JP); Eiji Horike, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 366 days.

(21) Appl. No.: 10/529,171

(22) PCT Filed: Sep. 19, 2003

(86) PCT No.: PCT/JP03/12006

§ 371 (c)(1),
(2), (4) Date: Mar. 24, 2005

(87) PCT Pub. No.: WO2004/030085

PCT Pub. Date: Apr. 8, 2004

(65) Prior Publication Data

US 2006/0021575 A1 Feb. 2, 2006

(30) Foreign Application Priority Data

Sep. 25, 2002 (JP) .............................. 2002-279991

(51) Int. Cl.
*B65H 1/00* (2006.01)
(52) U.S. Cl. ...................... 438/680; 414/805; 438/800; 257/E21.159
(58) Field of Classification Search ................ 414/217, 414/805, 935, 939, 936; 438/680, 800
See application file for complete search history.

(56) References Cited

U.S. PATENT DOCUMENTS

| 5,932,014 A | 8/1999 | Hayashi et al. |
| 6,602,793 B1 * | 8/2003 | Masterson ................... 438/706 |
| 2002/0159864 A1 * | 10/2002 | Lowrance ................... 414/217 |

FOREIGN PATENT DOCUMENTS

| EP | 1 152 456 | 11/2001 |
| JP | 05-021579 | 1/1993 |
| JP | 10-150090 | 6/1998 |
| JP | 11-026548 | 1/1999 |

\* cited by examiner

*Primary Examiner*—Michael Lebentritt
*Assistant Examiner*—Reema Patel
(74) *Attorney, Agent, or Firm*—Oblon, Spivak, McClelland, Maier & Neustadt, P.C.

(57) ABSTRACT

A method for carrying an object to be processed used for a processing apparatus which comprises a plurality of process chambers including a specific process chamber for a process in which the object in process is easily contaminated and a carrying mechanism having two picks. The method includes a plurality of carrying steps wherein the object in process is sequentially carried from one chamber to another among the plurality of process chambers. One of the two picks is used in carrying steps up right before carrying the object into the specific process chamber, and the other pick is used in the step of carrying the object into the specific process chamber and the later carrying steps.

15 Claims, 7 Drawing Sheets

METHOD FOR CARRYING OBJECT TO BE PROCESSED

FIELD OF THE INVENTION

The present invention relates to a method for transferring an object to be processed in a processing system performing a specified process on the object such as a semiconductor wafer and the like.

BACKGROUND OF THE INVENTION

Generally, when manufacturing a semiconductor device, a process for forming various thin films, a reforming process, an oxidation/diffusion process, an annealing process, an etching process and the like are sequentially and repeatedly carried out on a semiconductor wafer. For example, multilayer thin films can be formed on a semiconductor wafer.

For example, in a single wafer processing system, a plurality of process chambers is connected in common to a single transfer chamber in order to continuously perform the above various processes, thereby forming a so-called cluster processing apparatus. Further, a semiconductor wafer is transferred, so to speak, from one processing space to another, thereby sequentially and efficiently performing necessary processes in respective process chambers.

An example of a conventional processing system including such a cluster processing apparatus will be described with reference to FIG. 7.

As shown in FIG. 7, the processing system has a vacuum processing apparatus, wherein four process chambers 104A to 104D are connected to a common transfer chamber 102 of, e.g., a hexagon shape via gate valves 106, respectively. Further, a rectangular shaped loading transfer chamber 110 is connected to the common transfer chamber 102 via two load lock chambers 108A and 108B.

Gate valves 106 are interposed in coupling portions between the load lock chambers 108A and 108B and the common transfer chamber 102 and in coupling portions between the load lock chambers 108A and 108B and the loading transfer chamber 110, respectively. Further, coupled to the loading transfer chamber 110 are, e.g., three introduction ports 112 for mounting a cassette capable of accommodating plural sheets of semiconductor wafers and an orienter 114 for performing a position alignment of a semiconductor wafer W.

In addition, installed in the loading transfer chamber 110 is a loading carrying mechanism 116 which has two picks 116A and 116B for supporting the semiconductor wafer W and is contractible, extensible, revolvable, straightly movable vertically and horizontally. Further, disposed in the common transfer chamber 102 is a carrying mechanism 118 which has two picks 118A and 118B for supporting the semiconductor wafer W and is contractible, extensible and revolvable.

Herein, supposing that processes are performed on the semiconductor wafer W in respective process chambers 104A to 104D in that order, the semiconductor wafer W is transferred from the introduction port 112 as indicated by arrows. That is, the wafer W is transferred from, e.g., the central introduction port 112 to the orienter 114 while being supported by the pick 116A or 116B of the loading carrying mechanism 116. The position of the wafer W is aligned in the orienter 114 and then supported again by the pick 116A or 116B to be transferred into any one of the load lock chambers, e.g., the load lock chamber 108A. The wafer W transferred into the load lock chamber 108A is sequentially transferred from one chamber to another to pass through the respective process chambers 104A to 104D in that order by the pick 118A or 118B of the carrying mechanism 118 in the common transfer chamber 102. Necessary processes are carried out on the wafer W in the respective process chambers 104A to 104D. Then, the wafer W on which various processes have been completely performed is unloaded into the loading transfer chamber 110 via any one of the load lock chambers, e.g., the other load lock chamber 108B in this case and, thereafter, returns to the original introduction port 112.

In the respective carrying mechanisms 116 and 118, one of two picks is kept empty to improve a throughput. A wafer already mounted or accommodated in a place is picked up by an empty pick to thereby make the place empty. Then, a wafer supported by the other pick is mounted or accommodated in the above empty place. Accordingly, the wafers are smoothly exchanged, thereby improving the throughput.

Furthermore, as a conventional technique for preventing cross contamination, there is a processing system including a plurality of process chambers and a carrying mechanism having a plurality of picks being assigned to each process chamber (see, for example, pages 3 and 4, FIGS. 1 and 2 of Japanese Patent Laid-open Application No. H7-122612). In accordance with the technique, contaminants generated in any step (process chamber) do not affect other steps even though a wafer is transferred between process chambers.

SUMMARY OF THE INVENTION

However, a process in which a semiconductor wafer W can be easily contaminated may be performed in the process chambers 104A to 104D. For example, in case of performing a film forming process of a thin metal film such as a Cu film, a Ti film or a W (tungsten) film, such a kind of metal particle can be attached to the surface of the wafer. The metal particle serves as a nucleus, which can develop an abnormal growth of a film in a CVD film forming process. Further, another film is not deposited on a particle attached portion. Furthermore, particularly a Cu particle has a large diffusion coefficient in a Cu oxide film to thereby lower a dielectric constant of a $SiO_2$ film.

For example, when a film forming process for forming the thin metal film is performed in the process chamber 104C, if the respective picks 116A, 116B, 118A and 118B are operated while improving the throughput is the top priority of the operation as described above, all the respective picks 116A, 116B, 118A and 118B can support a wafer on which a process is completed in the process chamber 104C. Accordingly, particles of the metal film attached on a rear surface and the like of a wafer on which a process is completely performed can be attached to the picks 116A, 116B, 118A and 118B and, therefore, the wafer itself can be contaminated by the particles of the metal film when the wafer W is supported by the contaminated picks before being loaded into the process chamber 104C. Further, the picks may be contaminated by simply inserting the picks into the process chamber 104C performing the film forming process for forming the metal film.

The present invention is conceived for the purpose of effectively solving the above-described cross contamination problems. It is, therefore, an object of the present invention to provide a method for transferring an object to be processed, which is capable of preventing cross contamination (transmission of contamination) from occurring even though a throughput may be sacrificed.

In accordance with the present invention, there is provided a method for transferring an object to be processed in a processing apparatus, which has a number of process chambers including a specified process chamber for performing a process subject to contamination on the object; and a carrying mechanism having two picks, the method including a plurality of carrying steps of sequentially transferring the object from one chamber to another among the process chambers, wherein one pick of the two picks is used in carrying steps till right before the object is loaded into the specified process chamber, and the other pick of the two picks is used in a carrying step of loading the object into the specified process chamber and any subsequent carrying step for the object.

Since only one pick is used till right before the object is loaded into the specified process chamber in which contamination may easily occur and the other pick is used from the moment when the object is loaded into the specified process chamber and transferred thereafter, it becomes possible to control to the utmost cross contamination (contamination transmission) induced via the object and the picks.

In this case, preferably, the present invention method further includes a delivery step of conveying the object from the one pick to the other pick, the delivery step including the steps of placing the object on a buffer mechanism by the one pick; and moving the other pick to pick the object placed on the buffer mechanism.

In accordance with the present invention, there is further provided a method for transferring an object to be processed in a vacuum processing apparatus, which has a number of process chambers including a specified process chamber for performing a process subject to contamination on the object; a common transfer chamber which is connected in common to the respective process chambers; a carrying mechanism having two picks and provided in the common transfer chamber; a buffer mechanism for temporarily supporting the object and provided in the common transfer chamber; and one or more transfer ports for loading or unloading the object into or from the common transfer chamber, the method including a plurality of carrying steps in which the object is sequentially transferred from one chamber to another among the process chambers, wherein one pick of the two picks is used in carrying steps till right before the object is loaded into the specified process chamber, and the other pick of the two picks is used in a carrying step of loading the object into the specified process chamber and any subsequent carrying step for the object; and a delivery step of conveying the object from the one pick to the other pick by employing the buffer mechanism.

Also in this case, since the pick used for transferring the object till right before it is loaded into the specified process chamber performing a process in which contamination may easily occur on the object is different from the pick used when the object is loaded into the specified process chamber and transferred thereafter, it becomes possible to control to the utmost cross contamination (contamination propagation) caused via the object and the picks.

In accordance with the present invention, there is still further provided a method for transferring an object to be processed in a processing system having plural vacuum processing apparatuses connected via one or more pass portions, each vacuum processing apparatus including a number of process chambers; a common transfer chamber connected in common to the respective process chambers; and a carrying mechanism having two picks and provided in the common transfer chamber, wherein one process chamber of the processing system is a specified process chamber which performs a process subject to contamination on an object to be processed; a buffer mechanism for temporarily supporting the object is provided in a common transfer chamber connected to the specified process chamber or in a pass portion communicating with the common transfer chamber; and one of common transfer chamber is provided with one or more transfer ports for loading or unloading the object thereinto or therefrom, the method including a plurality of carrying steps in which the object is sequentially transferred from one chamber to another among the process chambers, wherein one pick of the two picks is used in carrying steps till right before the object is loaded into the specified process chamber, and the other pick of the two picks is used in a carrying step of loading the object into the specified process chamber and any subsequent carrying steps for the object; and a delivery step of conveying the object from said one pick to the other pick by employing the buffer mechanism.

Also in this case, since the pick used for transferring the object till right before it is loaded into the specified process chamber performing a process in which contamination may easily occur on the object is different from the pick used when the object is loaded into the specified process chamber and transferred thereafter, it becomes possible to control to the utmost cross contamination (contamination transmission) induced via the object and the picks.

Preferably, at least two object supporting mechanisms for supporting the object are provided in the pass portion; the object is supported by one of the object supporting mechanisms before being loaded into the specified process chamber; and the object is supported by another object supporting mechanism after being processed in the specified process chamber.

Further, preferably, the pass portion is provided with a gate valve for controlling common transfer chambers coupled via the pass portion to communicate with or to be isolated from each other; and each of the process chambers is provided with a gate valve for controlling a common transfer chamber connected thereto to communicate therewith or to be isolated therefrom; and wherein when the gate valve of the pass portion is closed, only one of the gate valves of process chambers connected to each common transfer chamber which is isolated by the pass portion is selectively opened; and when the gate valve of the pass portion is opened, only one of the gate valves of process chambers connected to common transfer chambers which communicate with each other by the pass portion is selectively opened.

In this case, it is possible to certainly prevent such a problem as contamination occurring by mixing different processing gases used in different process chambers.

Furthermore, preferably, the delivery step includes the steps of placing the object on the buffer mechanism by said one pick; and moving the other pick to pick the object placed on the buffer mechanism.

Moreover, preferably, the number of transfer ports is two, one of the transfer ports being used exclusively for loading and the other transfer port being used exclusively for unloading.

In this case, preferably, load lock chambers, each having a vacuum state and an atmospheric pressure state alternately therein, are respectively connected to the two transfer ports via gate valves; and a loading transfer chamber provided with a loading carrying mechanism having two picks is connected in common to load lock chambers via gate valves; and wherein one pick of the loading carrying mechanism is used when the object is loaded from the loading transfer chamber to the load lock chambers; and the other pick of the loading carrying mechanism is used when the object is unloaded from the load lock chambers to the loading transfer chamber.

In addition, for example, a process of depositing a thin metal film on the object is carried out in the specific process chamber.

DETAILED DESCRIPTION OF THE PREFERRED EMBODIMENT

Hereinafter, there will be described in detail a method for transferring an object to be processed in accordance with a preferred embodiment of the present invention with reference to accompanying drawings.

Figure 1:
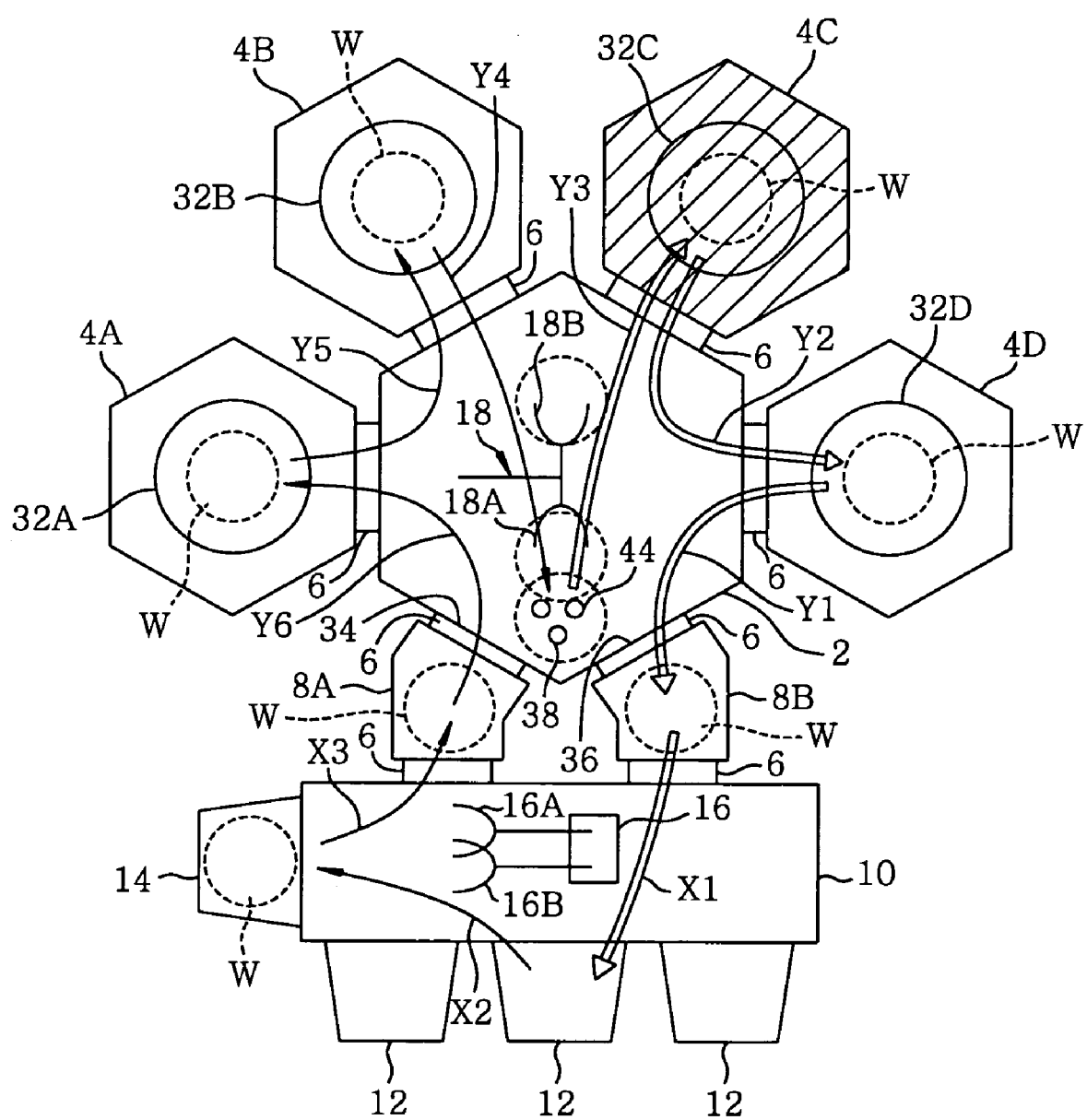
FIG. 1 provides a schematic diagram showing a configuration of an exemplary processing system for performing a transferring method in accordance with the present invention.
Figure 2:
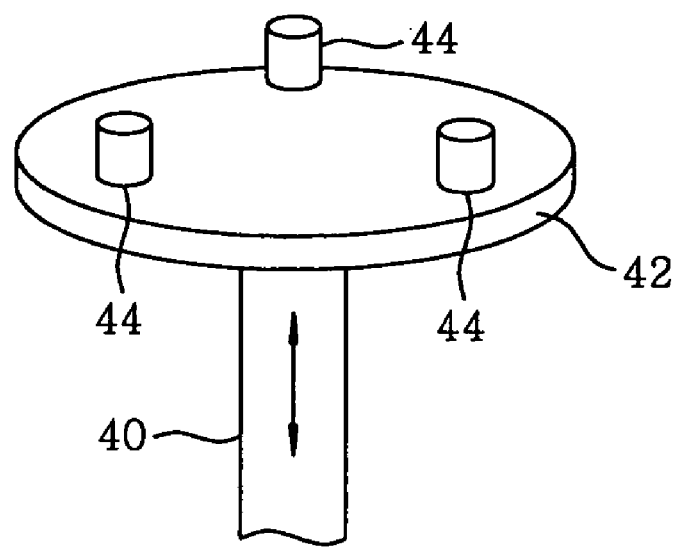
FIG. 2 shows a perspective view illustrating an exemplary buffer mechanism.

FIG. 1 is a schematic diagram showing a configuration of an exemplary processing system for performing a transferring method in accordance with the present invention and FIG. 2 is a perspective view illustrating an exemplary buffer mechanism.

As shown in FIG. 1, a processing system 30 has a vacuum processing apparatus, wherein four evacuable process chambers 4A to 4D are arranged to surround a single common transfer chamber 2 of, e.g., a hexagon shape and connected thereto via respective gate valves 6. The respective process chambers 4A to 4D are provided with susceptors 32A to 32D for mounting a semiconductor wafer W, i.e., an object to be processed and are configured to perform specified processes on the semiconductor wafer W. Further, a rectangular shaped loading transfer chamber 10 is connected to the common transfer chamber 2 via two evacuable load lock chambers 8A and 8B.

Gate valves 6 are respectively interposed in coupling portions between the load lock chambers 8A and 8B and the common transfer chamber 2 and in coupling portions between the load lock chambers 8A and 8B and the loading transfer chamber 10. Further, coupled to the loading transfer chamber 10 are, e.g., three, introduction ports 12 for mounting a cassette capable of accommodating plural sheets of semiconductor wafers and an orienter 14 for performing a position alignment of the semiconductor wafer W. The orienter 14 in the preferred embodiment performs the position alignment by way of optically obtaining an eccentric amount while rotating the semiconductor wafer W.

In addition, disposed in the loading transfer chamber 10 is a loading carrying mechanism 16 which has two picks 16A and 16B for supporting the semiconductor wafer W and is contractible, extensible, rotatable, straightly movable vertically and horizontally. Further, disposed in the common transfer chamber 2 is a carrying mechanism 18 which has two picks 18A and 18B for supporting the semiconductor wafer W and is contractible, extensible and rotatable.

Herein, a transfer port 34 of a coupling portion between the common transfer chamber 2 and either one of the two load lock chambers, e.g., the load lock chamber 8A, is exclusively used as a loading port for loading the semiconductor wafer into the common transfer chamber 2. On the other hand, a loading port 36 of a coupling portion between the common transfer chamber 2 and the other load lock chamber 8B is used exclusively as an unloading port for unloading the semiconductor wafer out of the common transfer chamber 2.

A buffer mechanism 38 for temporarily supporting the semiconductor wafer W is disposed in one corner of the common transfer chamber 2. The buffer mechanism 38 has an elevation rod 40 vertically moving, a plate shaped buffer base 42 disposed at a top end of the elevation rod 40 and, e.g., three, supporting pins 44 protruded on the buffer base 42, as shown in FIG. 2. The top ends of the three supporting pins 44 are configured to support the rear surface of the wafer W.

In the following, there will be described a method for transferring an object to be processed used for the processing system 30 configured above.

It is assumed that a process for depositing a thin metal film, e.g., a Cu film, in which contamination can easily occur on the semiconductor wafer W, is carried out in the process chamber 4C. The process chamber 4C in which the above process is performed will be treated as a specified process chamber. Further, the term "specified" is used herein simply to distinguish the chamber from the other process chambers.

When transferring the semiconductor wafer W on which a film forming process of a thin metal film is carried out in the process chamber 4C, unnecessary thin metal films attached on, e.g., the rear surface of the wafer W may be attached (transmitted) to the picks. Accordingly, in the present preferred embodiment, only one pick is exclusively employed as a contamination pick. The other pick is exclusively employed as a cleaning pick until right before the wafer W is loaded into the specified process chamber 4C. The cleaning pick may be contaminated by simply being inserted into the specified process chamber 4C. Accordingly, in the present preferred embodiment, the contamination pick is used also when the wafer W is loaded into the specific process chamber 4C. Further, if the contamination pick is inserted into the process chamber that performs a process right before a depositing process of a thin metal film, i.e., the process chamber 4B, the inside of the process chamber 4B may be contaminated. Accordingly, in the present preferred embodiment, the buffer mechanism 38 is used in performing an operation of delivering the semiconductor wafer from the cleaning pick to the contamination pick.

However, under the above condition, supposing that processes are performed on the semiconductor wafer W in the respective process chambers 4A to 4D in the order named, the semiconductor wafer W is transferred as indicated by arrows. At this time, the wafer is unloaded from a cassette (including a carrier) installed in one of the three introduction ports 12, e.g., the central introduction port 12. Further, one of the two load lock chambers 8A and 8B, e.g., the load lock chamber 8A, is used for loading the wafer W before the process begins in the specified process chamber 4C and the other load lock chamber 8B is used for unloading the wafer W after the process is completed in the specified process chamber 4C.

Furthermore, in the respective carrying mechanisms 16 and 18, one pick 16A or 18A of the two picks is employed as the cleaning pick and the other pick 16B or 18B is employed as the contamination pick. In the drawing, the route used by the cleaning pick is represented by black arrows and the route used by the contamination pick is indicated by white arrows.

As shown in FIG. 1, the process chambers 4A to 4D accommodate the wafers W, respectively. In this case, it is assumed that the process is completed or about to be completed in each of the process chambers 4A to 4D.

<Transfer Operations in the Loading Transfer Chamber 10>

First, operations in the loading transfer chamber 10 will be described. The wafer W accommodated in the load lock chamber 8B after being processed in all process chambers 4A to 4D is transferred to the central introduction port 12 along a transfer route X1 to be accommodated therein by the contamination pick 16B of the loading carrying mechanism 16.

Further, the unprocessed wafer W of the central introduction port 12 is transferred to the orienter 14 along a transfer route X2 by the cleaning pick 16A. The wafer W is position aligned in the orienter 14 and is accommodated in the other load lock chamber 8A by the cleaning pick 16A again. The above operations are repeatedly carried out whenever the process is performed on the wafer W.

<Transfer Operations in the Common Transfer Chamber 2>

Hereinafter, there will be described the wafer transfer operations in the common transfer chamber 2.

1. First, the contamination pick 18B of the carrying mechanism 18 moves to pick a wafer W on which a process is completed in the process chamber 4D and puts it in the empty load lock chamber 8B for a contaminated member after moving along a transfer route Y1.

2. Then, the contamination pick 18B moves to pick a wafer W on which a process is completed in the specified process chamber 4C and loads it into the empty process chamber 4D after moving along a transfer route Y2. Thereafter, a process is started in the process chamber 4D.

3. At this time, supported on the buffer mechanism 38 is the wafer W on which a process is already completed in the process chamber 4B. The contamination pick 18B moves to pick the wafer W mounted on the buffer mechanism 38 and loads it into the empty specified process chamber 4C after moving along a transfer route Y3. Thereafter, a process is started in the specific process chamber 4C.

4. Next, the cleaning pick 18A moves to pick the wafer W on which a process is completed in the process chamber 4B and puts it on the empty buffer mechanism 38 after moving along a transfer route Y4. The wafer W is standing by there.

5. Next, the cleaning pick 18A moves to pick the wafer W on which a process is completed in the process chamber 4A and transfers it into the empty process chamber 4B after moving along a transfer route Y5. Thereafter, a process is started in the process chamber 4B.

6. Next, the cleaning pick 18A moves to pick the unprocessed wafer W that is standing by in the load lock chamber 8A for a clean member and loads it into the empty process chamber 4A after moving along a transfer route Y6. Thereafter, a process is started in the process chamber 4A. Further, when loading/unloading the semiconductor wafer W, the corresponding gate valves 6 are operated to be opened/closed.

Further, whenever the process is completed on the semiconductor wafer W in the respective process chambers 4A to 4D, the above operations are repeatedly carried out.

As described above, the contamination picks 16B and 18B have to be used in the steps of transferring the wafer W into the specified process chamber 4C, and transferring the wafer which has a thin metal film formed thereon in the specified process chamber 4C to thereby most likely cause metal contamination. On the other hand, the cleaning picks 16A and 18A are used in the steps prior to the step of transferring the wafer W. By separately using the picks as described above, it becomes possible to prevent to the utmost cross contamination (contamination transmission) from occurring.

Moreover, the above transferring order is just an example and the transferring order in the process chambers 4A to 4D is not limited thereto. In every transfer route, the wafer on which a process is completed in the process chamber of the former step is temporarily supported by the buffer mechanism 38 up until right before the wafer is loaded into the process chamber performing a process in which contamination may easily occur on the wafer and, at this time, the wafer is transferred between the cleaning pick 18A and the contamination pick 18B. Accordingly, as described above, the cleaning pick 18A is prevented from being contaminated and, as a result, the wafer W can be prevented from being contaminated before being processed in the specified process chamber 4C.

<Modified Preferred Embodiment of the Processing System>

In the above-described preferred embodiment, there is described the transferring method in the processing system having the vacuum processing apparatus in which the plurality of process chambers 4A to 4D are connected to the single common transfer chamber 2. However, the present invention is not limited to such a kind of processing system. For example, the present invention can be applied to a processing system configured in a manner that connects a plurality of common transfer chambers (vacuum processing apparatuses).

Figure 3:
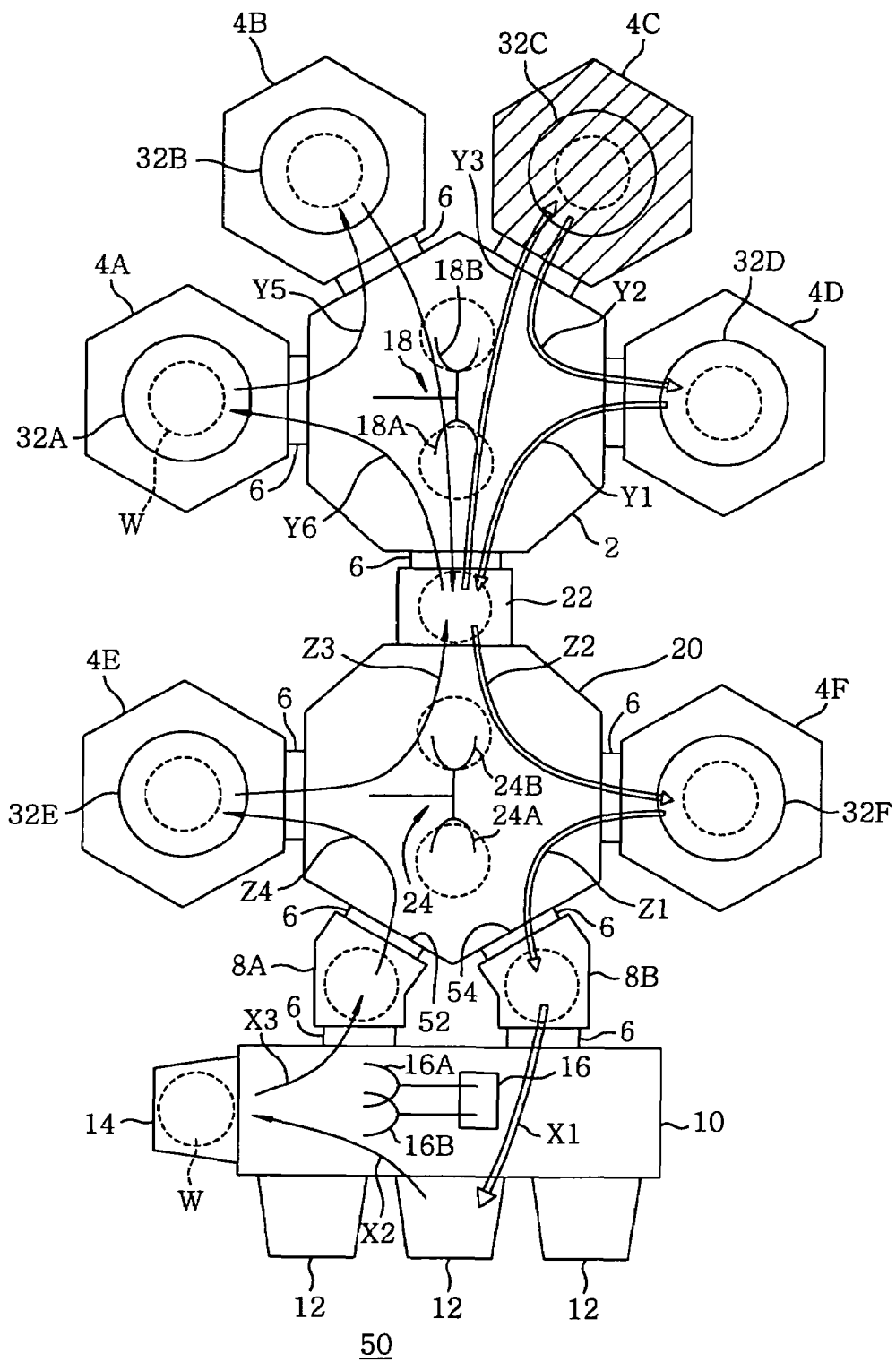
FIG. 3 describes a schematic diagram showing a configuration of an exemplary processing system in accordance with a modified preferred embodiment of the present invention.
Figure 4:
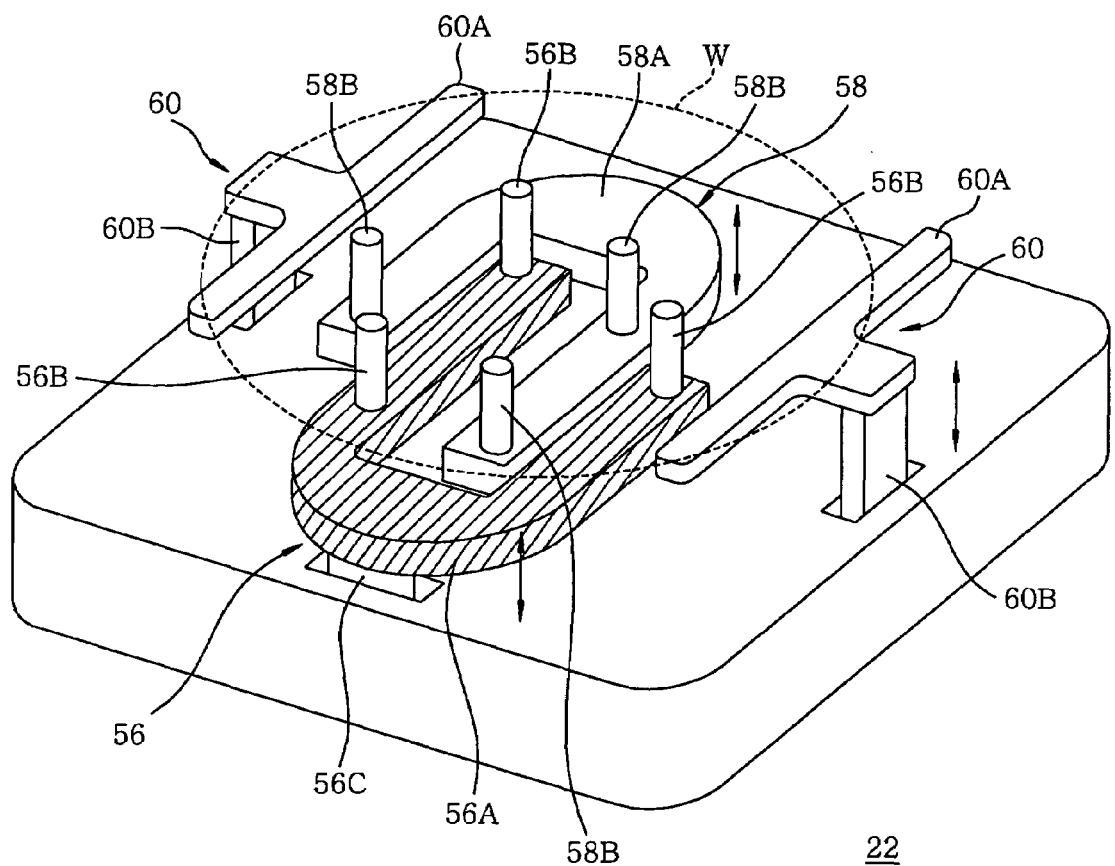
FIG. 4 sets forth a perspective view illustrating a pass portion also serving as a buffer mechanism.
Figure 5:
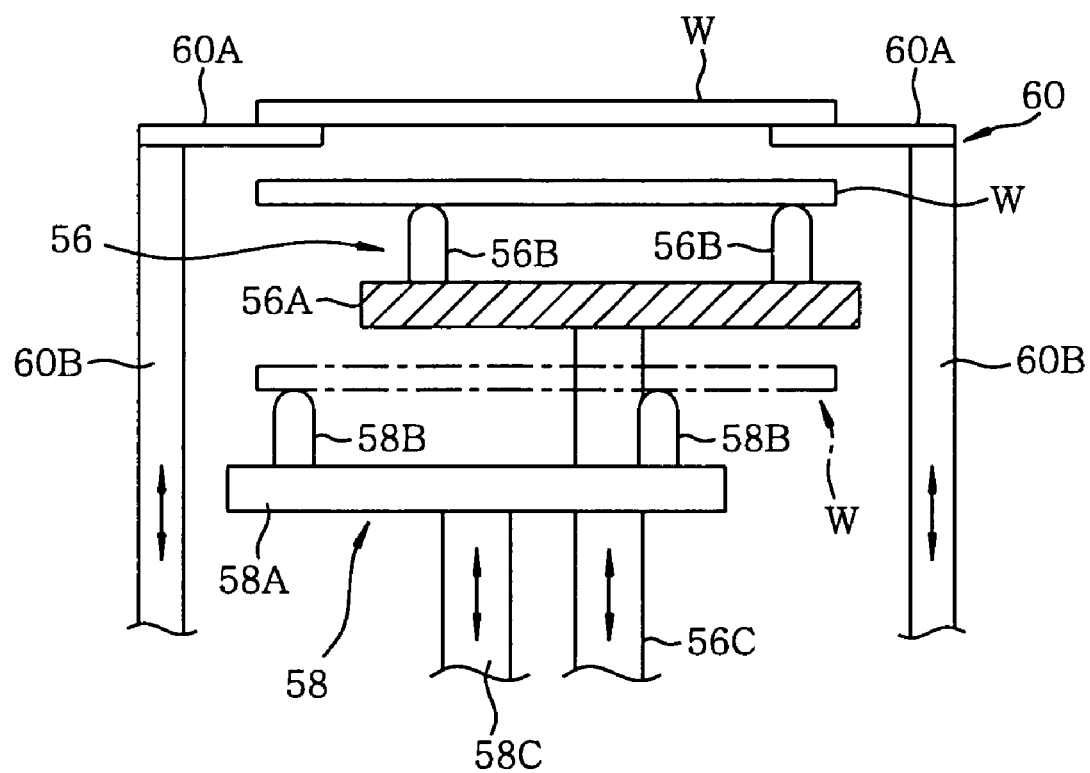
FIG. 5 depicts an explanatory diagram explaining operations in the pass portion.

FIG. 3 is a schematic diagram showing a configuration of an exemplary processing system in accordance with a modified preferred embodiment; FIG. 4 is a perspective view illustrating a pass portion (relay portion) also serving as a buffer mechanism; and FIG. 5 is an explanatory diagram explaining operations in the pass portion. The mechanism of the pass portion is represented in detail in Japanese Patent Application No. 2002-047509. Further, like reference numerals designate like parts having substantially identical functions and configurations in FIGS. 1 and 3.

Further, also in the present preferred embodiment, it is supposed that a process for forming a thin metal film that may cause contamination is performed in the specified process chamber 4C.

In a processing system 50 shown in FIG. 3, an additional second common transfer chamber 20 of a polygon, e.g., an irregular heptagon, is interposed between the first common transfer chamber 2 and the two load lock chambers 8A and 8B in the processing system 30 shown in FIG. 1. Two process chambers 4E and 4F are connected to the second common transfer chamber 20 via gate valves 6, respectively. Further, a pass portion 22 capable of making both the common transfer chambers 2 and 20 communicate with each other and temporarily supporting a wafer W is interposed between the second common transfer chamber 20 and the first common transfer chamber 2 to be connected thereto. When transferring the wafer W, the wafer is temporarily supported in the pass portion 22. As shown in FIG. 3, the first common transfer chamber 2 is also shaped as an irregular heptagon to connect the pass portion 22 thereto. A gate valve 6 is disposed in a joint between the first common transfer chamber 2 and the pass portion 22 whereby the common transfer chambers 2 and 20 can be made to communicate with each other or be blocked from each other.

In the same way, susceptors 32E and 32F for supporting the wafer W are disposed in the two process chambers 4E and 4F, respectively. Further, also in the second common transfer chamber 20, there is installed a carrying mechanism 24 which has two picks 24A and 24B and is contractible, extensible and rotatable. Further, the wafer is effectively transferred by the same operations as described above.

Furthermore, a transfer port 52 disposed in the coupling portion between the second common transfer chamber 20 and one of the two load lock chambers, e.g., the load lock chamber 8A, is used exclusively as a loading port for loading the semiconductor wafer into the second common transfer chamber 20. On the other hand, a transfer port 54 disposed in the coupling portion between the second common transfer chamber 20 and the other load lock chamber 8B is used exclusively as an unloading port for unloading the semiconductor wafer out of the second common transfer chamber 20.

In the processing system 50, the buffer mechanism 38 shown in FIG. 1 is not provided in the first common transfer chamber 2. The pass portion 22 also performs the function of the buffer mechanism 38.

As shown in FIGS. 4 and 5, two object supporting mechanisms 56 and 58 are disposed in the central portion of the pass portion 22 and a pair of object supporting mechanisms 60 is disposed outside them. The two object supporting mechanisms 56 and 58 positioned in the central portion have base plates 56A and 58A formed in an approximate U-shape, respectively. Respective three supporting pins 56B and 58B are disposed to be protruded upward on the respective base plates 56A and 58A. The central portions of the rear surfaces of the wafers W can be respectively, separately and independently supported by respective groups of the supporting pins 56B and 58B. As shown in FIG. 4, the U-shaped base plates 56A and 58A are inserted to be fitted to and placed slightly apart from each other. Further, as shown in FIG. 5, the base plates 56A and 58A are respectively connected to top ends of elevation rods 56C and 58C which are extended from below to thereby move vertically, separately and independently. Further, bellows (not shown) are disposed in the base portions of the elevation rods 56C and 58C. Accordingly, the elevation rods 56C and 58C can move vertically while maintaining airtightness of the inside of the pass portion 22.

As described above, a single wafer W can be supported by either of the two object supporting mechanisms 56 and 58. FIG. 5 shows a state where the object supporting mechanism 56 supports a single wafer W.

As a buffer function, a wafer W is supported by either one of the object supporting mechanisms 56 and 58, e.g., the object supporting mechanism 56 (partially indicated by oblique lines in FIG. 4), right before is loaded into the specified process chamber 4C. Further, the other object supporting mechanism 58 supports a wafer W on which a process is completed in the specified process chamber 4C. That is, the object supporting mechanism 58 functions as an object supporting mechanism for a contaminated member.

Meanwhile, the object supporting mechanism 60 positioned outside both the object supporting mechanisms 56 and 58 has a pair of supporting plates 60A on the left and the right and elevation rods 60B for supporting the supporting plates 60A at the top ends. The supporting plates 60A can move vertically while supporting the peripheral portion of the rear surface of the wafer W. Disposed also in the base portions of the elevation rods 60B are bellows (not shown). Accordingly, the elevation rods 60B are vertically movable while maintaining airtightness of the inside of the pass portion 22.

The object supporting mechanism 60 supports the wafer W at a higher position, as shown in FIG. 5. In this case, the object supporting mechanism 60 is used when the wafer W is loaded from the second common transfer chamber 20 to the first common transfer chamber 2. That is, the object supporting mechanism 60 functions as an object supporting mechanism for a clean member.

That is, while the object supporting mechanism 60 for a clean member supports a wafer W at a higher position, under the wafer W, the object supporting mechanism 56 for buffering temporarily supports a wafer W to be transferred, which is about to be loaded into the specific process chamber 4C, or the object supporting mechanism 58 for a contaminated member can support a wafer W which has to be unloaded and on which a process is completed. That is, two sheets of wafers W can be simultaneously supported in the whole pass portion 22.

Hereinafter, there will be described a method for transferring an object to be processed in the processing system 50.

First, as described above, it is supposed that a process in which contamination can easily occur on a wafer is carried out in the specified process chamber 4C. Further, in the respective carrying mechanisms 18 and 24, one pick, e.g., the pick 18A or 24A, is employed as a cleaning pick and only the other pick 18B or 24B is employed as a contamination pick. Further, operations of the loading carrying mechanism 16 are entirely identical to that described in FIG. 1 and, thus, the description thereof will be omitted.

It is assumed that processes are carried out on the semiconductor wafer W in the process chamber 4E, the process chamber 4A, the process chamber 4B, the specific process chamber 4C, the process chamber 4D, and the process chamber 4F in the order named. Further, the wafer W is transferred as indicated by arrows in FIG. 3. Also in this case, the route used by the cleaning pick is represented by black arrows and the route used by the contamination pick is indicated by white arrows. Moreover, as described above, since transferring operations are entirely identical in the loading transfer chamber 10 shown in FIGS. 1 and 3, the description thereof will be omitted.

<Transferring Operations in the Second Common Transfer Chamber 20>

First, there will be described wafer transferring operations in the second common transfer chamber 20.

1. First, the contamination pick 24B of the carrying mechanism 24 moves to pick the wafer W on which a process is completed in the process chamber 4F and puts it in the empty load lock chamber 8B for a contaminated member after moving along a transfer route Z1.

2. Then, the contamination pick 24B moves to pick a wafer W on which a thin metal film has been deposited and which is supported on the supporting pins 58B (see, FIGS. 4 and 5) of the object supporting mechanism 58 for a contaminated member in the pass portion 22, and transfers it into the empty process chamber 4F after moving along a transfer route Z2. Thereafter, a process is started in the process chamber 4F.

3. Next, the cleaning pick 24A moves to pick a wafer W on which a process is completed in the process chamber 4E and puts it on both the supporting plates 60A of the empty object supporting mechanisms 60 for a clean member in the pass portion 22 after moving along a transfer route Z3. As shown in FIG. 5, the wafer W is supported at a higher position by both the supporting plates 60A. Further, as described above, in this state, any one of the other two object supporting mechanisms 56 and 58 can support another wafer W.

4. Next, the cleaning pick 24A moves to pick an unprocessed wafer W that is standing by in the load lock chamber 8A for a clean member and loads it into the empty process chamber 4E after moving along a transfer route Z4. Thereafter, a process is started in the process chamber 4E. Further, when loading/unloading the semiconductor wafer W, the corresponding gate valves 6 are operated to be opened/closed.

Furthermore, whenever the processes are completed on the semiconductor wafer W in the respective process chambers 4E and 4F, the above operations are repeatedly carried out.

<Transferring Operations in the Common Transfer Chamber 2>

1. First, the contamination pick 18B of the carrying mechanism 18 moves to pick a wafer W on which a process is completed in the process chamber 4D and puts it on the supporting pins 58B of the empty object supporting mechanism 58 for a contaminated member in the pass portion 22 after moving along a transfer route Y1. The wafer W put on the supporting pins 58B is immediately transferred to the second common transfer chamber 20 and, thus, portions on the supporting pins 58 become empty again.

2. Then, the contamination pick 18B moves to pick a wafer W on which a process is completed in the specified process chamber 4C and loads it into the vacant process chamber 4D after moving along a transfer route Y2. Thereafter, a process is started in the process chamber 4D.

3. At this time, a wafer W1 on which a process is already completed in the process chamber 4B before, is supported on the supporting pins 56B (see, FIGS. 4 and 5) of the object supporting mechanism 56 for buffering in the pass portion 22 serving as a buffer mechanism. The contamination pick 18B moves to pick a wafer W that is supported on the supporting pins 56B and loads it into the empty specified process chamber 4C after moving along a transfer route Y3. Thereafter, a process is started in the specified process chamber 4C.

4. Then, the cleaning pick 18A moves to pick a wafer W on which a process is completed in the process chamber 4B and puts it on the empty supporting pins 56B after moving along a transfer route Y4. The wafer W is standing by there.

5. Next, the cleaning pick 18A moves to pick a wafer W on which a process is completed in the process chamber 4A and transfers it into the empty process chamber 4B after moving along a transfer route Y5. Thereafter, a process is started in the process chamber 4B.

6. Next, the cleaning pick 18A moves to pick an unprocessed wafer W that is standing by while being supported by the supporting plates 60A of the object supporting mechanism 60 for a clean member in the pass portion 22 and loads it into the vacant process chamber 4A after moving along a transfer route Y6. Thereafter, a process is started in the process chamber 4A. Further, when loading/unloading the semiconductor wafer W, the corresponding gate valves 6 are operated to be opened/closed.

In addition, whenever the processes are completed on the semiconductor wafer W in the respective process chambers 4A to 4D, the above operations are repeatedly carried out.

As described above, the contamination picks 16B, 18B and 24B have to be used in the steps of transferring a wafer W into the specified process chamber 4C and transferring the wafer which has a thin metal film formed thereon in the specified process chamber 4C to thereby most likely cause metal contamination. On the other hand, in the steps prior to the step of transferring the wafer W, the cleaning picks 16A, 18A and 24A are used. By separately using the picks as described above, it becomes possible to prevent to the utmost cross contamination (contamination transmission) from occurring.

Further, the above transferring order is just an example and the transferring order in the respective process chambers 4A to 4F is not limited thereto. In every transfer route, right before loading a wafer into the specified process chamber, a wafer on which a process is completed in the process chamber of the former step is temporarily supported by the object supporting mechanism 56 for buffering in the pass portion 22 and, at this time, the wafer is transferred between the cleaning pick 18A and the contamination pick 18B. Accordingly, as described above, the cleaning pick 18A is prevented from being contaminated and, as a result, a wafer W before being processed in the specified process chamber 4C can be prevented from being contaminated.

Further, in the present preferred embodiment, an openable and closable gate valve 6 is interposed between the pass portion 22 communicating with the second common transfer chamber 20 and the first common transfer chamber 2. Furthermore, in order to prevent cross contamination from occurring by processing gases in the respective process chambers 4A to 4F, opening/closing operations of the respective gate valves 6 are limited when transferring a wafer. In the present preferred embodiment, the gate valve 6 is not opened in such a state that the process chambers communicate with each other. In other words, it is avoided that the gate valves 6 of two or more process chambers are simultaneously opened and, thus, a plurality of process chambers communicate with each other even temporarily.

As is generally known, employed as a processing gas are a gas which can cause cross contamination, a corrosion gas, a gas which becomes explosive when mixed with another gas, and the like. Accordingly, generally, when the gate valves of the respective process chambers are opened, the inner pressures of the common transfer chambers 2 and 22 become to be positive pressures, e.g., about 27 Pa (200 mTorr) higher than that of the process chambers, by a nonreactive gas, e.g., a $N_2$ gas. Accordingly, even though the gate valve is opened, a remaining processing gas in the process chamber does not flow into the common transfer chambers.

Further, in the present preferred embodiment, in order to certainly prevent occurrence of contamination or the like, the gate valves of two or more process chambers are not opened at the same time. For example, when both the common transfer chambers 2 and 20 do not communicate with each other by closing the gate valve 6 disposed between the pass portion 22 and the first common transfer chamber 2, the respective gate valves 6 of the process chambers 4A to 4D connected to the first common transfer chamber 2 are controlled such that only one gate valve among them is opened. Meanwhile, the respective gate valves 6 of the process chambers E and 4F and the load lock chambers 8A and 8B connected to the second common transfer chamber 20 are also controlled such that only one gate valve among them is opened.

With regard to this, when both the common transfer chambers 2 and 20 communicate with each other by opening the gate valve 6 of the pass portion 22, the respective gate valves 6 of all the process chambers 4A to 4F and the load lock chambers 8A and 8B are controlled such that only one gate valve among them is opened.

Accordingly, since two or more process chambers can be hindered from simultaneously communicating with each other, it is possible to prevent cross contamination created by processing gases, outflow of a corrosion gas and generation of an explosive gas due to mixing.

Further, in the processing system shown in FIG. 3, the gate valve 6 is disposed in the pass portion 22 whereby the common transfer chambers 2 and 20 can conveniently be made to communicate with each other or blocked from each other. However, the gate valve 6 may not be provided in the pass portion 22 when the possibility of cross contamination induced by processing gases is low. In this case, both the common transfer chambers 2 and 20 always communicate with each other via the pass portion 22.

Furthermore, in the preferred embodiment, the pass portion 22 also serves as a buffer mechanism. However, the present invention is not limited thereto, as described with reference to FIG. 2, the buffer mechanism 38 may be additionally provided at one corner in the first common transfer chamber 2. In this case, the pass portion 22 need not serve as a buffer mechanism. That is, the buffering object supporting mechanism 56 that plays a role of the buffer mechanism can be removed from the pass portion 22 shown in FIG. 4.

Figure 6:
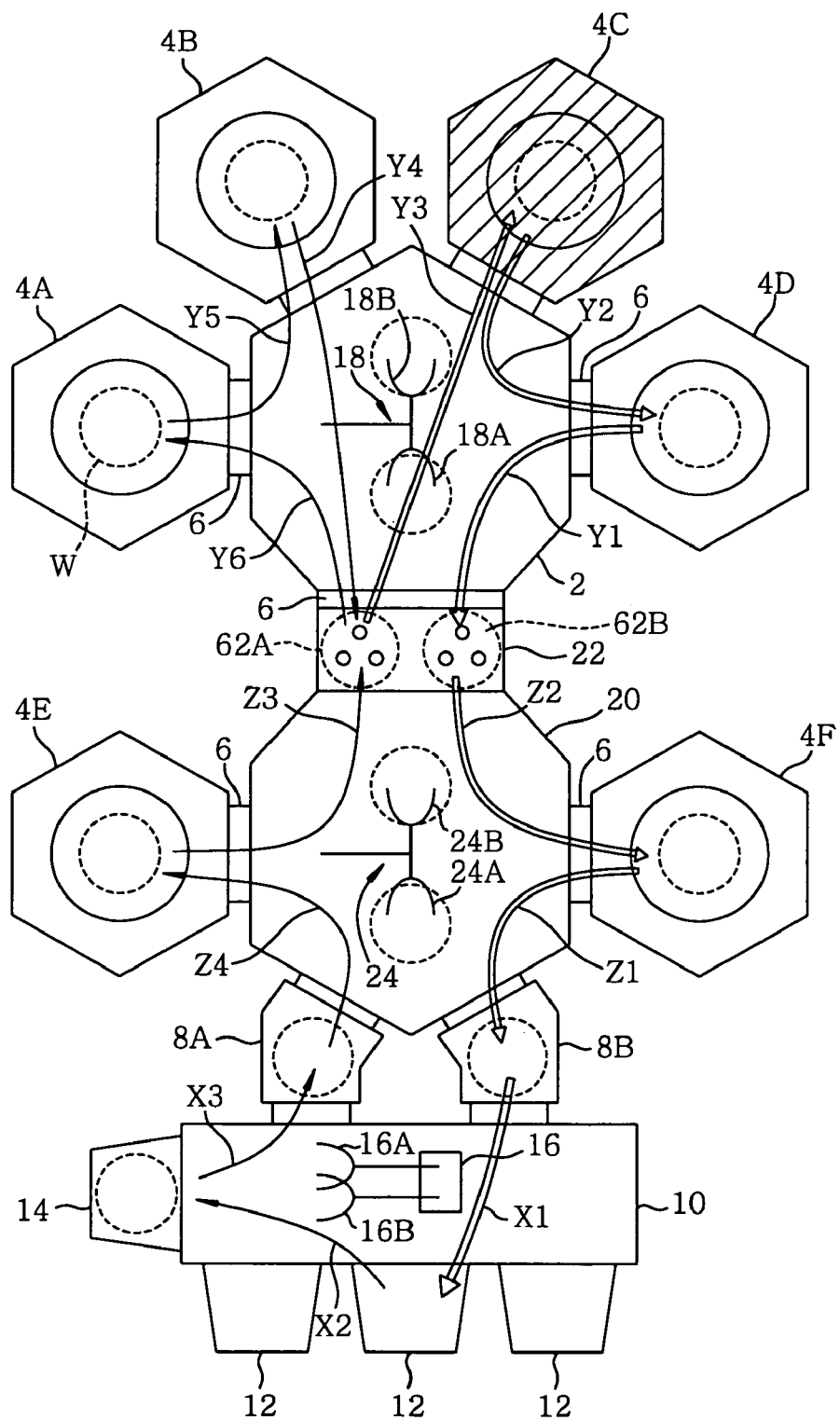
FIG. 6 illustrates a schematic diagram showing a configuration of an exemplary processing system in accordance with another modified preferred embodiment of the present invention.
Figure 7:
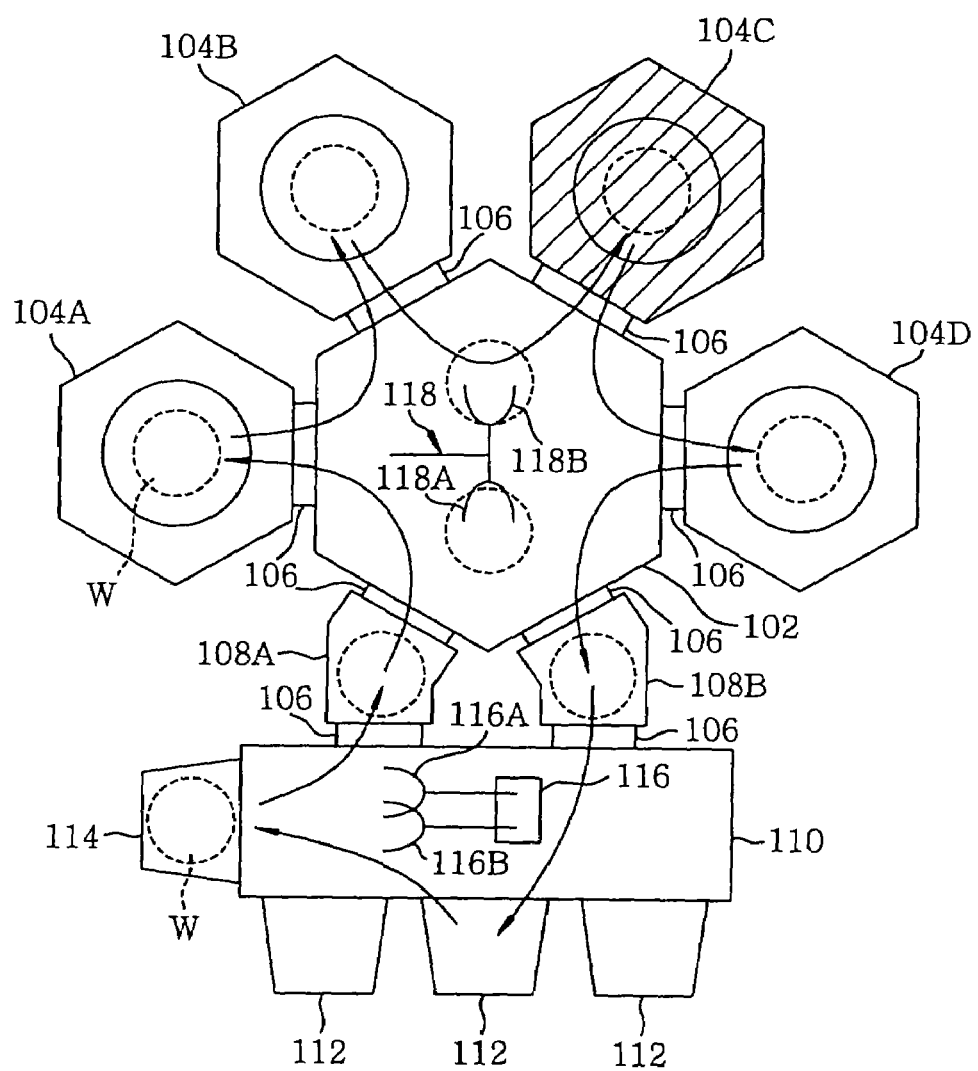
FIG. 7 shows an exemplary conventional processing system including a cluster processing apparatus.

Moreover, in the preferred embodiment, the first and the second common transfer chamber 2 and 20 have unoccupied portions capable of being connected to process chambers (sides of a polygon), to which the above process chambers are not connected. Small-sized process chambers for performing a preheating, a cooling and the like of wafers can be connected to the unoccupied portions capable of being connected to process chambers. Accordingly, in the preferred embodiment, the object supporting mechanisms 56, 58 and 60 are vertically disposed at multiple levels in order to secure spaces for installing the small-sized process chambers. However, in case that small-sized process chambers need not be connected to the common transfer chamber, as shown in FIG. 6, two buffer mechanisms 62A and 62B identical to the buffer mechanism 38 described with reference to FIG. 2 may be disposed in parallel in the pass portion 22.

In this case, the buffer mechanism 62A functions as an object supporting mechanism for a clean member, which relays a clean wafer W from the second common transfer chamber 20 to the first common transfer chamber 2. Further, the buffer mechanism 62A functions as an object supporting mechanism for buffering and transfers a wafer W between the picks 18A and 18B. The wafer is transferred in a manner that both functions do not conflict with each other. Further, the buffer mechanism 62B functions as an object supporting mechanism for a contaminated member, which relays the wafer W processed in the process chamber 4C from the first common transfer chamber 2 to the second common transfer chamber 20. In this case, the transfer sequence is the same as that shown in FIG. 6.

Further, in the preferred embodiment, it is assumed that the wafer W is mounted on the tables in the load lock chambers 8A and 8B and then a preheating or a cooling of the wafer W is carried out. For this reason, the load lock chamber 8A is used exclusively for loading and the load lock chamber 8B is used exclusively for unloading. However, when a preheating or a cooling of a wafer is not carried out in the load lock chambers, the buffer mechanism 38 described with reference to FIG. 2 can be employed instead of the above tables. An area of front ends of the supporting pins 44 of the buffer mechanism 38 have to be small. If the area where a wafer W makes a contact with the front ends of the supporting pins 44 is small, even though in case the unprocessed wafer and the processed wafer are transferred via an identical load lock chamber, the wafer is relatively slightly damaged by cross contamination. That is, in this case, only one load lock chamber can be used. Further, one transfer port is provided in the first common transfer chamber 2 shown in FIG. 1 and the second common transfer chamber 20 shown in FIG. 3.

In addition, though there is described an exemplary case where the semiconductor wafer is used as the object in the preferred embodiment, the present invention can be applied to a case of processing an LCD substrate, a glass substrate or the like without being limited thereto.

While the invention has been shown and described with respect to the preferred embodiments, it will be understood by those skilled in the art that various changes and modifications may be without departing from the spirit and scope of the invention as defined in the following claims.

What is claimed is:

1. A method for transferring an object to be processed in a processing apparatus, which has a number of process chambers including a specified process chamber for performing a process subject to contamination on the object; and a carrying mechanism having two picks, the method comprising:

a plurality of carrying steps of sequentially transferring the object from one chamber to another among the process chambers, wherein one pick of the two picks is used in carrying steps till right before the object is loaded into the specified process chamber, and the other pick of the two picks is used in a carrying step of loading the object into the specified process chamber and any subsequent carrying step for the object.

2. The method of claim 1, further comprising a delivery step of conveying the object from the one pick to the other pick, the delivery step including the steps of:

placing the object on a buffer mechanism by the one pick; and moving the other pick to pick the object placed on the buffer mechanism.

3. A method for transferring an object to be processed in a vacuum processing apparatus, which has a number of process chambers including a specified process chamber for performing a process subject to contamination on the object; a common transfer chamber which is connected in common to the respective process chambers; a carrying mechanism having two picks and provided in the common transfer chamber; a buffer mechanism for temporarily supporting the object and provided in the common transfer chamber; and one or more transfer ports for loading or unloading the object into or from the common transfer chamber, the method comprising:

a plurality of carrying steps in which the object is sequentially transferred from one chamber to another among the process chambers, wherein one pick of the two picks is used in carrying steps till right before the object is loaded into the specified process chamber, and the other pick of the two picks is used in a carrying step of loading the object into the specified process chamber and any subsequent carrying step for the object; and a delivery step of conveying the object from the one pick to the other pick by employing the buffer mechanism.

4. A method for transferring an object to be processed in a processing system having plural vacuum processing apparatuses connected via one or more pass portions, each vacuum processing apparatus including a number of process chambers; a common transfer chamber connected in common to the respective process chambers; and a carrying mechanism having two picks and provided in the common transfer chamber, wherein one process chamber of the processing system is a specified process chamber which performs a process subject to contamination on an object to be processed; a buffer mechanism for temporarily supporting the object is provided in a common transfer chamber connected to the specified process chamber or in a pass portion communicating with the common transfer chamber; and one of common transfer chamber is provided with one or more transfer ports for loading or unloading the object thereinto or therefrom, the method comprising:

a plurality of carrying steps in which the object is sequentially transferred from one chamber to another among the process chambers, wherein one pick of the two picks is used in carrying steps till right before the object is loaded into the specified process chamber, and the other pick of the two picks is used in a carrying step of loading the object into the specified process chamber and any subsequent carrying steps for the object; and a delivery step of conveying the object from said one pick to the other pick by employing the buffer mechanism.

5. The method of claim 4, wherein at least two object supporting mechanisms for supporting the object are provided in the pass portion;

the object is supported by one of the object supporting mechanisms before being loaded into the specified process chamber; and the object is supported by another object supporting mechanism after being processed in the specified process chamber.

6. The method of claim, wherein the pass portion is provided with a gate valve for controlling common transfer chambers coupled via the pass portion to communicate with or to be isolated from each other; and each of the process chambers is provided with a gate valve for controlling a common transfer chamber connected thereto to communicate therewith or to be isolated therefrom; and wherein when the gate valve of the pass portion is closed, only one of the gate valves of process chambers connected to each common transfer chamber which is isolated by the pass portion is selectively opened; and when the gate valve of the pass portion is opened, only one of the gate valves of process chambers connected to common transfer chambers which communicate with each other by the pass portion is selectively opened.

7. The method of any one of claim 3, wherein the delivery step includes the steps of:

placing the object on the buffer mechanism by said one pick; and moving the other pick to pick the object placed on the buffer mechanism.

8. The method of claim 3, wherein the number of transfer ports is two, one of the transfer ports being used exclusively for loading and the other transfer port being used exclusively for unloading.

9. The method of claim 8, wherein load lock chambers, each having a vacuum state and an atmospheric pressure state alternately therein, are respectively connected to the two transfer ports via gate valves; and a loading transfer chamber provided with a loading carrying mechanism having two picks is connected in common to load lock chambers via gate valves; and wherein one pick of the loading carrying mechanism is used when the object is loaded from the loading transfer chamber to the load lock chambers; and the other pick of the loading carrying mechanism is used when the object is unloaded from the load lock chambers to the loading transfer chamber.

10. The method of claim 1, wherein a process of depositing a thin metal film on the object is carried out in the specific process chamber.

11. The method of claim 4, wherein the delivery step includes the steps of:

placing the object on the buffer mechanism by said one pick; and moving the other pick to pick the object placed on the buffer mechanism.

12. The method of claim 4, wherein the number of transfer ports is two, one of the transfer ports being used exclusively for loading and the other transfer port being used exclusively for unloading.

13. The method of claim 12, wherein load lock chambers, each having a vacuum state and an atmospheric pressure state alternately therein, are respectively connected to the two transfer ports via gate valves; and a loading transfer chamber provided with a loading carrying mechanism having two picks is connected in common to load lock chambers via gate valves; and wherein one pick of the loading carrying mechanism is used when the object is loaded from the loading transfer chamber to the load lock chambers; and the other pick of the loading carrying mechanism is used when the object is unloaded from the load lock chambers to the loading transfer chamber.

14. The method of claim 3, wherein a process of depositing a thin metal film on the object is carried out in the specific process chamber.

15. The method of claim 4, wherein a process of depositing a thin metal film on the object is carried out in the specific process chamber.

* * * * *